(12) United States Patent
Lee

(10) Patent No.: US 8,073,093 B2
(45) Date of Patent: Dec. 6, 2011

(54) PHASE SYNCHRONOUS DEVICE AND METHOD FOR GENERATING PHASE SYNCHRONOUS SIGNAL

(75) Inventor: Ki Won Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 937 days.

(21) Appl. No.: 11/776,148

(22) Filed: Jul. 11, 2007

(65) Prior Publication Data
US 2008/0159443 A1    Jul. 3, 2008

(30) Foreign Application Priority Data

Dec. 27, 2006 (KR) .................. 10-2006-0135723

(51) Int. Cl.
*H03D 3/24* (2006.01)

(52) U.S. Cl. ......... 375/374; 375/327; 375/371; 375/376

(58) Field of Classification Search .................. 375/326, 375/327, 371, 376, 354; 331/16; 370/504; 714/12; 327/157, 156, 536
See application file for complete search history.

(56) References Cited

U.S. PATENT DOCUMENTS

| | | | | |
|---|---|---|---|---|
| 5,408,202 A | * | 4/1995 | Shirazi et al. | 331/8 |
| 5,945,855 A | * | 8/1999 | Momtaz | 327/157 |
| 5,987,085 A | * | 11/1999 | Anderson | 375/374 |
| 6,081,571 A | * | 6/2000 | Jansson | 375/376 |
| 6,320,469 B1 | * | 11/2001 | Friedberg et al. | 331/1 A |
| 6,337,590 B1 | * | 1/2002 | Millar | 327/158 |
| 6,388,482 B1 | * | 5/2002 | Schnell et al. | 327/158 |
| 6,549,079 B1 | * | 4/2003 | Crook | 331/17 |
| 6,617,884 B2 | * | 9/2003 | Wang et al. | 327/12 |
| 6,812,754 B1 | * | 11/2004 | Nakanishi | 327/157 |
| 6,933,758 B2 | * | 8/2005 | Kim et al. | 327/161 |
| 6,998,889 B2 | * | 2/2006 | Best | 327/157 |
| 7,019,570 B2 | * | 3/2006 | Starr | 327/156 |
| 7,046,093 B1 | * | 5/2006 | McDonagh et al. | 331/16 |
| 7,199,672 B2 | * | 4/2007 | Munker et al. | 331/16 |
| 2004/0202271 A1 | * | 10/2004 | Fahim | 375/376 |
| 2006/0203948 A1 | * | 9/2006 | Lin | 375/375 |

FOREIGN PATENT DOCUMENTS

| | | |
|---|---|---|
| KR | 1996-0008796 | 3/1996 |
| KR | 100179917 B1 | 11/1998 |
| KR | 100225332 B | 10/1999 |
| KR | 2001-0062016 A | 7/2001 |
| KR | 1020040016586 | 2/2004 |
| KR | 2006-0041335 A | 5/2006 |
| KR | 2007-0035923 A | 4/2007 |
| KR | 2007-0036579 A | 4/2007 |

* cited by examiner

*Primary Examiner* — Shuwang Liu
*Assistant Examiner* — Helene Tayong
(74) *Attorney, Agent, or Firm* — Ladas & Parry LLP

(57) ABSTRACT

Disclosed are a phase synchronous device for improving jitter of an output signal and a method for generating a phase synchronous signal. The phase synchronous device includes a phase detector detecting a phase difference between first and second signals to output a phase detection signal and a locking signal; a control signal generator adjusting a slope of the phase detection signal in response to the locking signal; and a charge pumping unit outputting a control voltage in response to an output of the control signal generator. The speed of a control signal applied to the charge pumping unit is adjusted in response to the locking signal, so that a peak current is reduced, and thus jitter of an output signal is improved by being reduced or minimized.

16 Claims, 7 Drawing Sheets

PHASE SYNCHRONOUS DEVICE AND METHOD FOR GENERATING PHASE SYNCHRONOUS SIGNAL

CROSS-REFERENCE TO RELATED APPLICATIONS

The present application claims priority to Korean patent application number 10-2006-0135723 filed on Dec. 27, 2006, which is incorporated herein by reference in its entirety.

BACKGROUND OF THE INVENTION

The present invention relates to a phase synchronous device, and more precisely to a phase synchronous device for improving jitter of an output signal and a method for generating a phase synchronous signal.

In general, most circuits include clock circuits for high-speed operation, such as a phase locked loop (hereinafter, referred to as a "PLL") and a delay locked loop (hereinafter, referred to as a "DLL").

Meanwhile, each of the PLL and DLL includes a phase detector, a charge pump, a loop filter and a voltage controller.

In each of the PLL and DLL, the phase detector compares the phases of first and second signals with each other to generate first and second pulses corresponding to a difference between the phases of the first and second signals.

Here, the first signal is a reference input signal, and the second signal is a feedback output signal. In the PLL, the first and second signals are frequency signals. In the DLL, the first and second signals are clock signals.

The first pulse is a pull-up pulse and activated when the phase of the second signal is lagged with respect to that of the first signal. The second pulse is a pull-down pulse and activated when the phase of the second signal is led with respect to that of the first signal. When the phases of the first and second signals are locked, the first and second pulses are simultaneously activated during a short interval.

The charge pump drives PMOS and NMOS transistors respectively corresponding to the first and second pulses so as to pump a current.

The loop filter charges/discharges the current to output a control voltage.

The voltage controller controls the phase of the second signal corresponding to the control voltage and then outputs an output signal.

Such an operation is repeatedly performed until the phases of the first and second signals approach within a predetermined range to be locked.

In each of the PLL and DLL, when the phases of the first and second signals are locked, the first and second pulses are simultaneously activated during a short interval. At this time, a peak current having a current difference is generated due to the mismatch in current driving capabilities of the PMOS and NMOS transistors constituting the charge pump.

Since such a peak current flows in the range of a few hundreds μA to a few μA even a reference current is a few mA, the charge pump causes a difference between amounts of currents flowing through the PMOS and NMOS transistors.

As a result, there is a problem in that, when the phases of the first and second signals is locked, a control voltage output from the loop filter is unstable, and thus jitter is produced in the second signal controlled by the voltage controller.

SUMMARY OF THE INVENTION

The present invention provides a phase synchronous device in which a peak current is reduced by adjusting the speed of a control signal applied to a charge pump corresponding to a locking signal, so that jitter of an output signal can be improved by being reduced or minimized.

Also, the present invention provides a method for generating a phase synchronous signal.

The present invention provides a scheme to stabilize a data valid window in a high-frequency device by using the output signal in which jitter is reduced or minimized.

The present invention provides a phase synchronous device that includes a phase detector configured to detect a phase difference between first and second signals to output a phase detection signal and configured to lock a locking signal; a control signal generator configured to adjust a slope of the phase detection signal in response to the locking signal; and a charge pumping unit configured to output a control voltage in response to an output of the control signal generator.

Preferably, the first signal is an input signal, and the second signal is a feedback output signal. Preferably, the first and second signals are frequency or clock signals.

The control signal generator may include a selector configured to select a path of the phase detection signal corresponding to the locking signal; and a slope adjuster configured to adjust the slope of the phase detection signal.

The selector may include a transmission unit configured to transmit the phase detection signal to the charge pumping unit when the locking signal is not activated and configured to transmit the phase detection signal to the slope adjuster when the locking signal is activated.

Preferably, the transmission unit includes a transmission gate.

Preferably, the slope adjuster is configured to allow the slope of the phase detection signal to be adjusted by an RC element, in which the RC element is a capacitor.

Preferably, the slope adjuster is configured to adjust the slope of the phase detection signal such that an output current of the charge pumping unit reaches a predetermined current level while the locking signal is activated. Preferably, the current level is a reference current level applied to the charge pumping unit.

The charge pump may also be configured to output a current in response to an output of the control signal generator; and a loop filter configured to charge/discharge the current and configured to output the control voltage.

The phase synchronous device may include a voltage controller configured to control a phase of the second signal.

The present invention also provides a method for generating a phase synchronous signal. The method includes a first step of detecting a phase difference between first and second signals to output a phase detection signal and a locking signal; a second step of adjusting a slop of the phase detection signal in response to the locking signal so as to output a control signal; a third step of pumping a current in accordance with the control signal and charging/discharging the current so as to output a control voltage; and a fourth step of controlling a phase of the second signal in accordance with the control voltage.

Preferably, the second step outputs the control signal having a slope smaller than that of the phase detection signal when the locking signal is activated. Preferably, the slope of the control signal is adjusted by an RC delay of the phase detection signal and the slope of the control signal is adjusted such that the current level reaches a predetermined current level before the locking signal is not activated. Preferably, the current level is a reference current level applied to a charge pump.

DESCRIPTION OF SPECIFIC EMBODIMENTS

Hereinafter, preferred embodiments of the present invention will be described in detail with reference to the accompanying drawings.

In one embodiment of the phase synchronous device of the present invention, the slope of a control signal is applied to a charge pump in response to a locking signal is adjusted, so that a peak current can be reduced, and a control voltage applied to a voltage controller, so that jitter of an output signal can be improved by being reduced or minimized.

Figure 1:
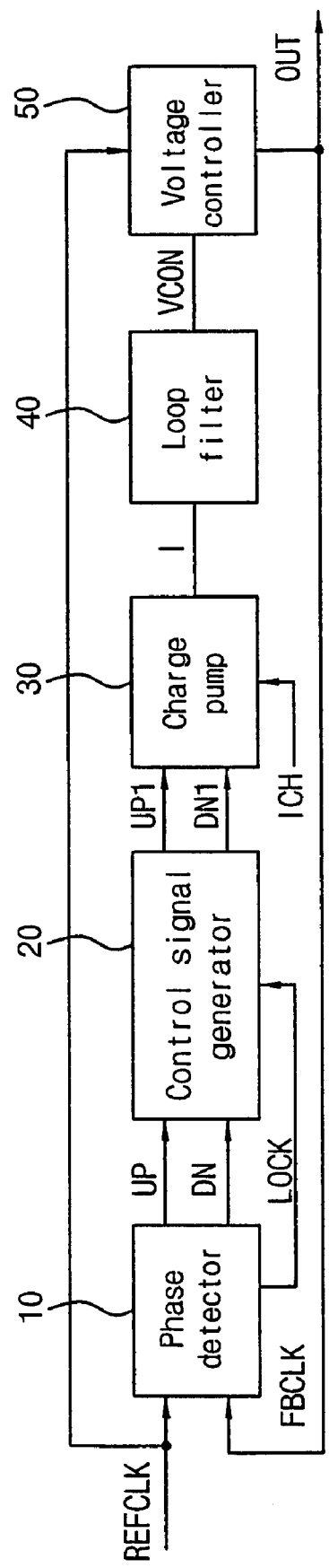
FIG. 1 depicts a block diagram of a phase synchronous device according to an embodiment of the present invention.

Referring to FIG. 1, a preferred phase synchronous device of the present invention includes a phase detector 10, a control signal generator 20, a charge pump 30, a loop filter 40 and a voltage controller 50.

The phase detector 10 is configured to compare the phases of first and second signals REFCLK and FBCLK from each other to generate first and second pulses UP and DN corresponding to a difference between the phases of the first and second signals REFCLK and FBCLK.

Here, the first signal REFCLK is a reference input signal, and the second signal FBCLK is a feedback output signal. In a PLL, the first and second signals REFCLK and FBCLK are frequency signals. In a DLL, the first and second signals REFCLK and FBCLK are clock signals.

The first pulse UP is a pull-up pulse and activated when the phase of the second signal FBCLK is lagged with respect to that of the first signal REFCLK. The second pulse DN is a pull-down pulse and activated when the phase of the second signal FBCLK is led with respect to that of the first signal REFCLK. When the phases of the first and second signals are locked, the first and second pulses UP and DN are simultaneously activated during a short interval.

The control signal generator 20 is configured to selectively vary the speeds of the first and second pulses UP and DN corresponding to a locking signal LOCK so as to output first and second control signals UP1 and UP2.

Here, the locking signal LOCK is a signal enabled when the phases of the first and second signals REFCLK and FBCLK approaches within a predetermined range to be locked. Here, the predetermined range is a value temporarily set in a design of the phase synchronous device.

The charge pump 30 is configured to drive PMOS and NMOS transistors respectively corresponding to the first and second control signals UP1 and DN1 so as to pump a current I.

The loop filter 40 is configured to charge/discharge the current I to output a control voltage VCON.

The voltage controller 50 is configured to control the phase of the second signal FBCLK corresponding to the control voltage VCON. If the phases of the first and second signals, the voltage controller 50 is configured to output an output signal OUT.

Figure 2A:
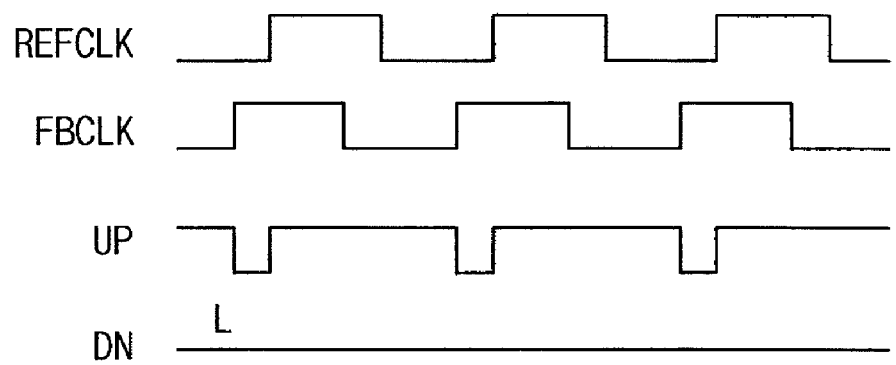
FIGS. 2a to 2c depict waveform diagrams of pulses output from a phase detector.

Referring to FIG. 2a, when the phase of the second signal FBCLK is lagged with respect to that of the first signal REFCLK, the phase detector 10 is configured to allow the first pulse UP to be activated as a low level, and the second pulse DN is output as a low state, L.

Figure 2B:
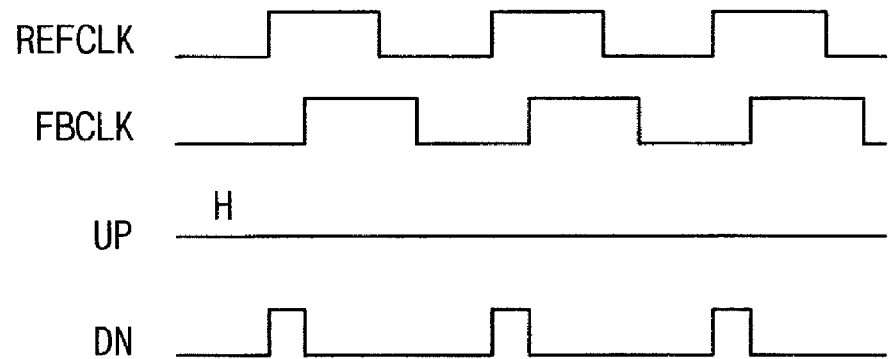

Referring to FIG. 2b, when the phase of the second signal FBCLK is led with respect to that of the first signal REFCLK, the phase detector 10 allows the second pulse DN to be activated as a high level, and the first pulse UP is output as a high state.

Figure 2C:
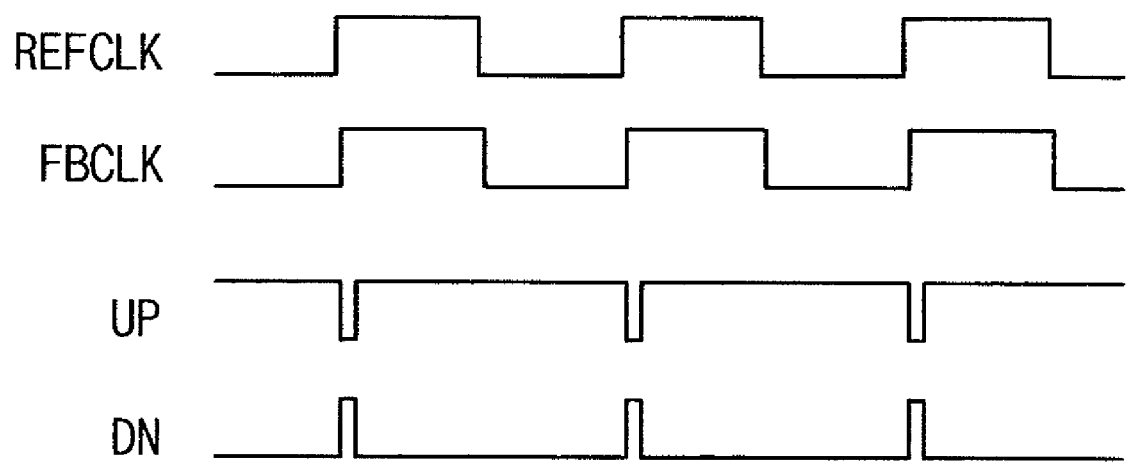

Referring to FIG. 2c, when the phases of the first and second signals REFCLK and FBCLK are locked, the phase detector 10 is configured to allow the first and second pulses UP and DN to be activated in the form of a shot.

Figure 3:
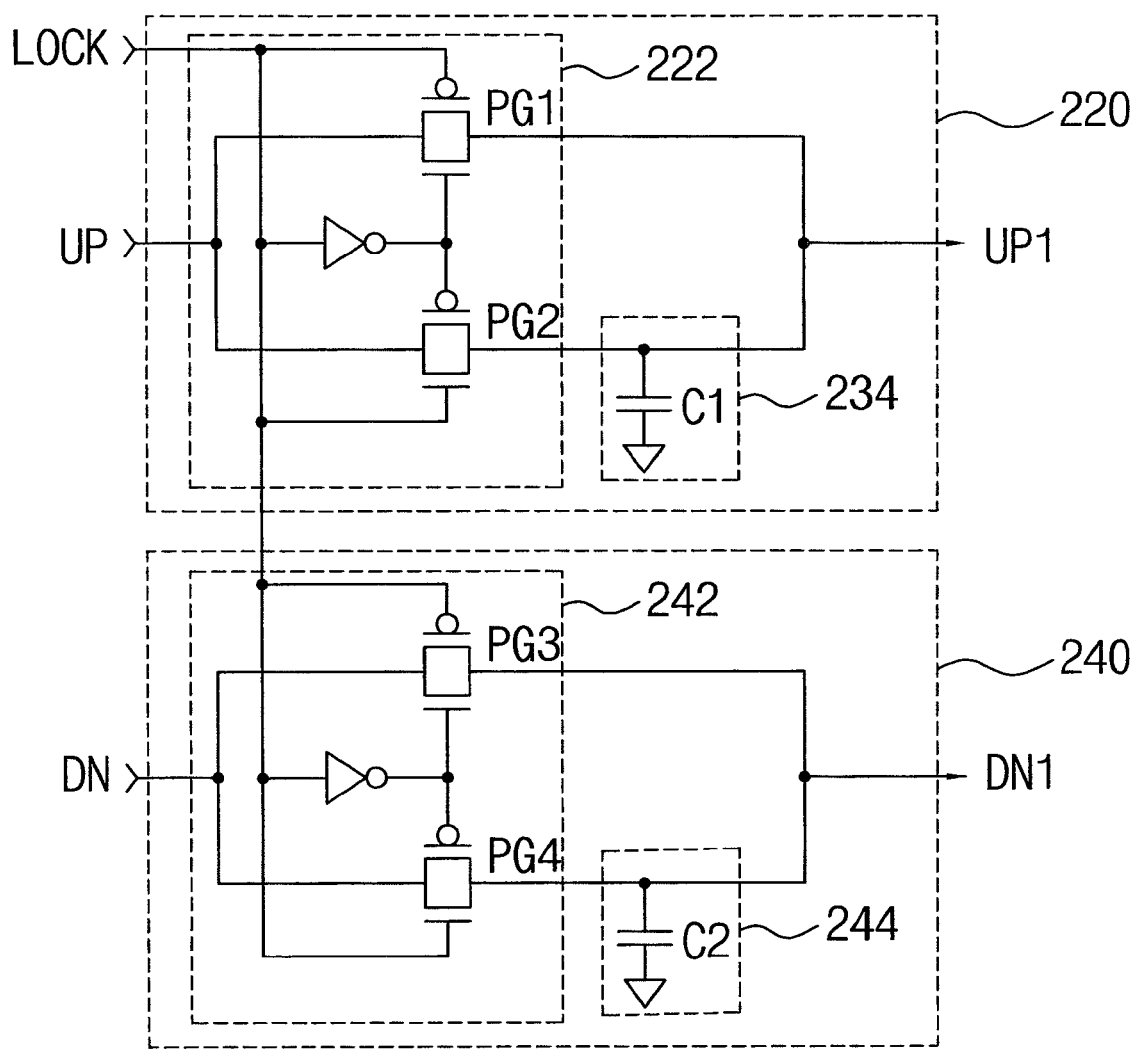
FIG. 3 depicts a detailed circuit diagram of a control signal generator.

Referring to FIG. 3, the control signal generator 20 includes a first adjuster 220 is configured to selectively adjust the slope of the first pulse UP to output the first control signal UP1 and a second adjuster 240 is configured to selectively adjust the slope of the second pulse DN to output the second control signal DN1.

The first and second adjusters 220 and 240 respectively include selectors 222 and 242 and slope adjusters 234 and 244.

The selectors 222 and 242 may respectively include transmission gates PG1 and PG3 are configured to output the first and second pulses UP and DN as the first and second control signals UP1 and DN1 when the locking signal LOCK is not activated, and transmission gates PG2 and PG4 are configured to transmit the first and second pulses UP and DN to the slope adjusters 224 and 244.

The slope adjusters 234 and 244 are respectively implemented with capacitors C1 and C2 connected between the transmission gates PG2 and PG4 and a ground terminal. However, it will be apparent that the slope adjusters 234 and 244 may be implemented with other RC elements such as resistors.

As described above, when the locking signal LOCK is activated, the first and second pulses UP and DN transmitted to the slope adjusters 234 and 244 are output as the first and second control signals UP1 and DN1 of which slopes are gently activated by the capacitor C1 and C2, respectively. That is, the capacitors C1 and C2 generates a delay of $\tau=RC$. Here, $\tau$ denotes a time taken when a signal reaches from the level of a ground voltage VSS to the level of VDD/2 that is a half of a power source voltage VDD, R denotes a resistance, and C denotes a capacitance.

Figure 4A:
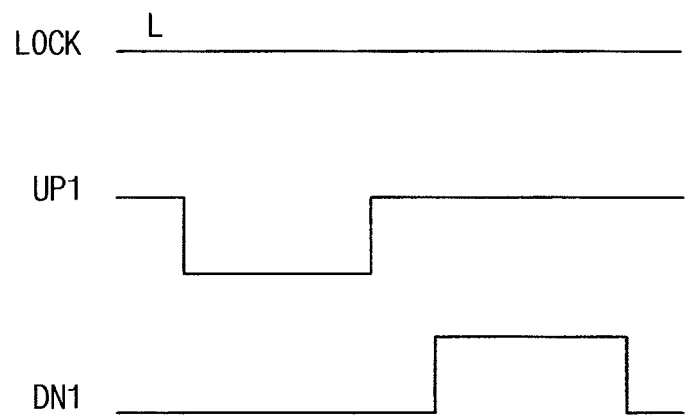
FIGS. 4a and 4b depict waveform diagrams of control signals output from the control signal generator.

Referring to FIG. 4a, when the locking signal LOCK is not activated, i.e., when a phase difference between the first and second signals REFCLK and FBCLK exists, the control signal generator 20 is configured to turn on the transmission gate PG1 or PG3 to output the first or second pulse UP or DN as the first or second control signal UP1 or DN1.

In other words, before the locking signal LOCK is activated, the control signal generator 20 is configured to output the first or second pulse UP or DN as the first or second control signal UP1 or DN1 without distortion in the slope of the first or second pulse UP or DN, so that a time deadzone can be prevented or at least minimized. Here, the time deadzone refers to a time interval at which the charge pump 30 is not driven due to a small amplitude of a control signal applied thereto.

Figure 4B:
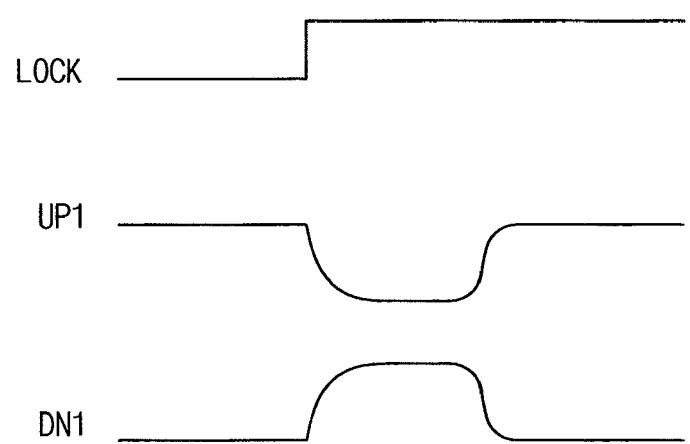

Referring to FIG. 4b, when the locking signal LOCK is activated, i.e., when the phases of the first and second signals REFCLK and FBCLK approaches within a predetermined range to be locked, the control signal generator 20 is configured to turn on the transmission gates PG2 and PG4 to transmit the first and second pulses UP and DN respectively to the slope adjusters 234 and 244. The slope adjusters 234 and 244 are configured to gently adjust the slopes of the first and second pulses UP and DN to be output as the first and second control signals UP1 and DN1.

Figure 5:
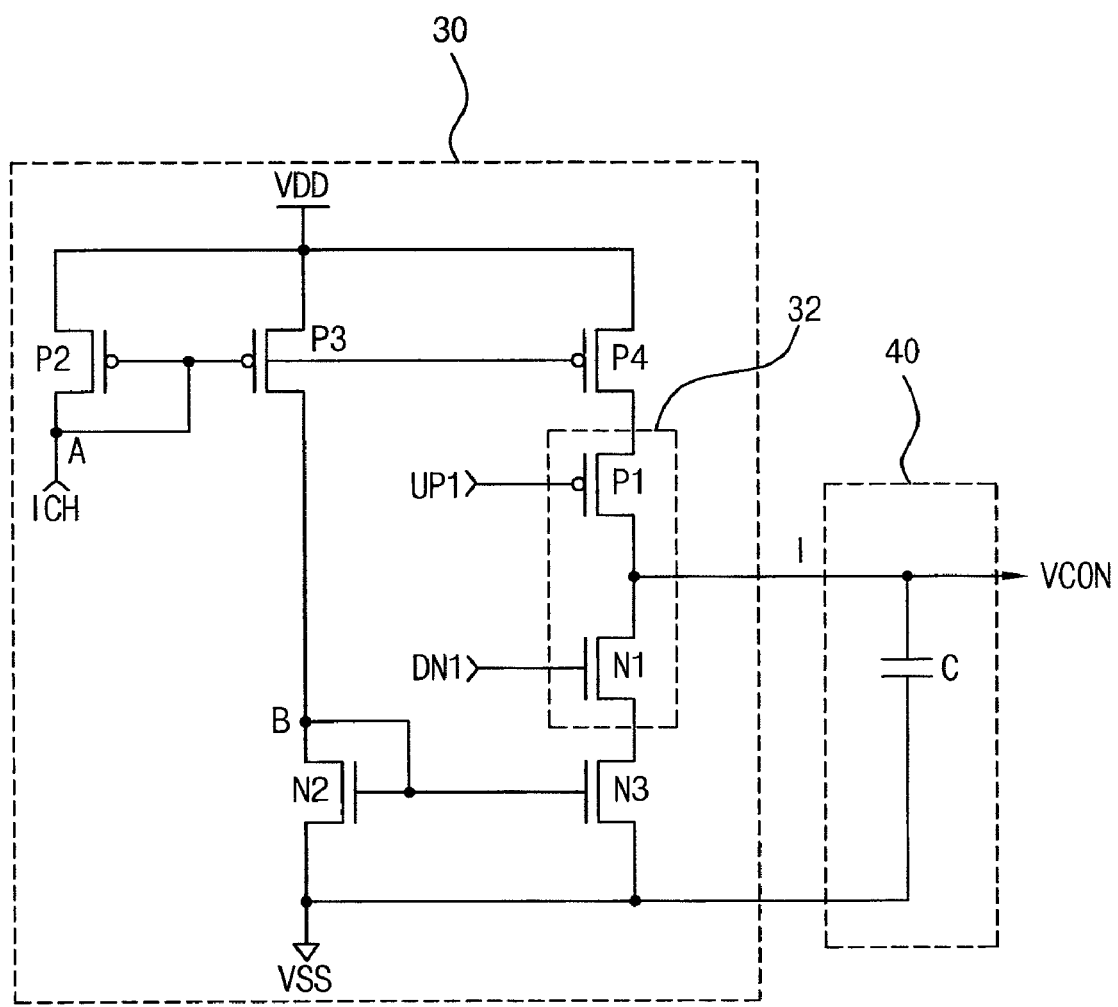
FIG. 5 depicts a detailed circuit diagram of a charge pump an a loop filter.

Referring to FIG. 5, the charge pump 30 is configured as a current mirror including PMOS transistors P2, P3 and P4, NMOS transistors N2 and N3, and a switching unit 32, the PMOS transistors P2, P3 and P4 having gates connected to node A and sources connected to a power source voltage VDD, the NMOS transistors N2 and N3 having gates connected to node B and sources connected to a ground voltage VSS, and the switching unit 32 being connected between the PMOS and NMOS transistors P4 and N3. A reference current ICH applied to the node A flows through the PMOS transistors P2, P3 and P4, the NMOS transistors N2 and N3, and the switching unit 32.

The switching unit 32 is configured to be controlled by the first and second control signal UP1 and DN1. The switching unit 32 includes PMOS and NMOS transistors P1 and N1 pumping a current I.

The loop filter 40 includes a capacitor C connected between an output terminal of the switching unit 32 and the ground voltage VSS. Here, although one capacitor is illustrated for convenience of illustration, it will be readily understood by those skilled in the art that various circuits performing the same function as the loop filter 40 may be implemented.

An operation of the phase synchronous device will be discussed. When the locking signal LOCK is not activated, the charge pump 30 is activated corresponding to the phase difference between the first and second signals REFCLK and FBCLK. The current I is pumped by the first or second control signal UP1 or DN1 having a steep slope as shown in FIG. 4a.

For example, when the first UP1 is activated, the PMOS transistor P1 is configured to be turned on to increase the current I. When the second control signal DN1 is activated, the NMOS transistor N1 is configured to be turned on to decrease the current I.

Thus, the loop filter 40 is configured to charge/discharge the capacitor C corresponding to the amplitude of the current I varied before the locking signal LOCK is activated, and configured to output a variable control voltage VCON. The voltage controller 50 is configured to control the phase of the second signal FBCLK in response to the control voltage VCON.

On the other hand, when the locking signal LOCK is activated, the switching unit 32 is configured to be driven by the first and second control signals UP1 and DN1 having gentle slopes as shown in FIG. 4b. For this reason, in the charge pump 30, switching of the PMOS and NMOS transistors P1 and N1 is gently performed to decrease a peak current. Since the same amount of current flows through the PMOS and NMOS transistors P1 and N1, the current I is constantly maintained.

Here, the slopes of the first and second control signals UP1 and DN1 are controlled such that the level of the current I can reach that of the reference current ICH before the locking signal LOCK is not activated.

Thus, the loop filter 40 is configured to charge/discharge the capacitor C corresponding to the amplitude of the current I stabilized after the locking signal LOCK is activated, and configured to output a stabilized control voltage VCON. The voltage controller 50 is configured to output the second signal FBCLK as an output signal OUT in response to the control voltage VCON.

Figure 6A:
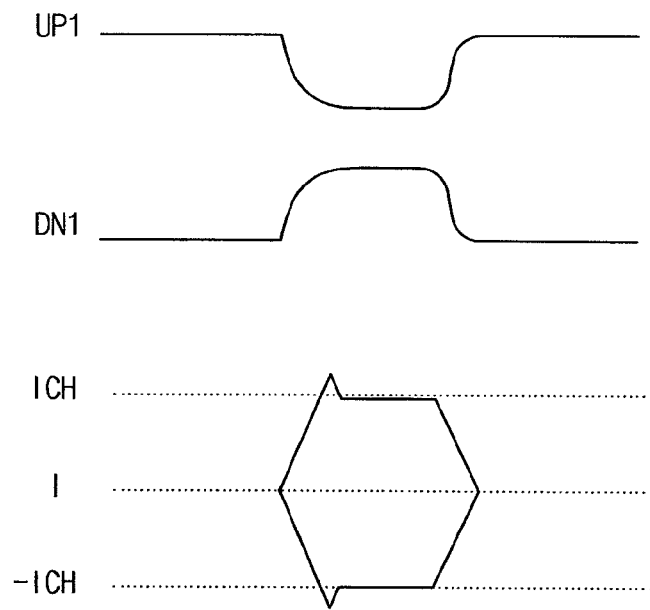
FIG. 6a depicts a waveform diagram of a current output from a conventional charge pump in locking.

Referring to FIG. 6a, since a conventional charge pump is controlled by first and second pulses UP and DN activated to have a steep slope when a locking signals is activated, the peak amplitude of a current I is very large.

Figure 6B:
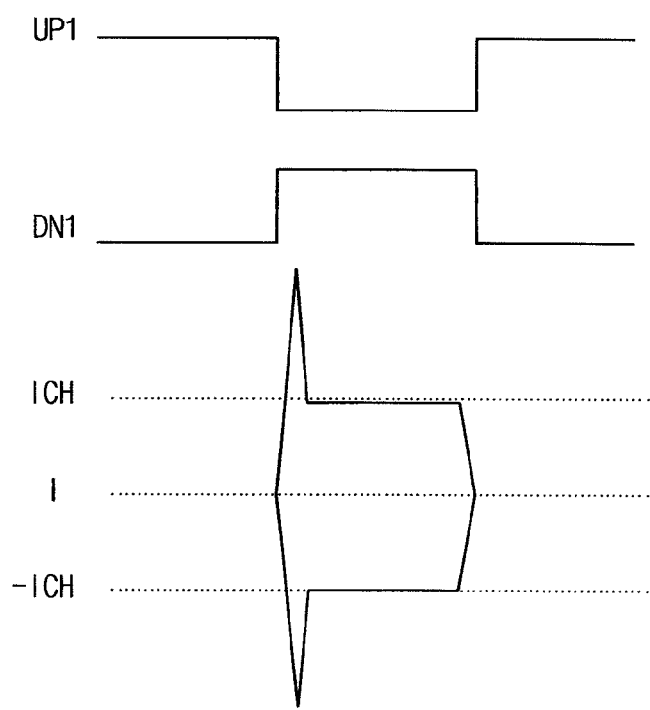
FIG. 6b depicts a waveform diagram of a current output from the charge pump of the present invention in locking.

Referring to FIG. 6b, the charge pump of the present invention is configured to be controlled by first and second control signals UP1 and DN1, then the charge pump is configured to be gently activated by adjusting the slopes of first and second pulses UP and DN when a locking signal is activated.

As described above, the slope of the control signal applied to the charge pump corresponds to the locking signal, so that a peak current is reduced, and thus a control voltage is stabilized. Accordingly, jitter of an output signal can be improved by being reduced or minimized.

As a result, since a data valid window is ensured, the phase synchronous device is suitable for high-speed operation.

Accordingly, in a phase synchronous device and a method for generating a phase synchronous signal of the present invention, there arises an operational advantage in that a peak current is reduced by adjusting the speed of a control signal applied to a charge pump corresponding to a locking signal, so that jitter of an output signal can be improved by being reduced or minimized.

Further, according to the present invention, there arises another operational advantage in that a data valid window in a high-frequency device is stabilized by the output signal of which jitter is reduced or minimized.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A phase synchronous device, comprising:
   a phase detector configured to detect a phase difference between first and second signals and configured to output a phase detection signal and a locking signal;
   a control signal generator configured to adjust a slope of the phase detection signal in response to the locking signal; and
   a charge pumping unit configured to output a control voltage in response to an output of the control signal generator,
   wherein the locking signal is enabled when phases of the first and second signals approach within a predetermined range to be locked; and
   the control signal generator adjust the slope of the phase detection signal when the locking signal is activated,
   wherein the control signal generator includes:
   a selector configured to select a path of the phase detection signal corresponding to the locking signal; and
   a slope adjuster configured to adjust the slope of the phase detection signal,
   wherein the selector includes a transmission unit configured to transmit the phase detection signal to the charge pumping unit when the locking signal is not activated and configured to transmit the phase detection signal to the slope adjuster when the locking signal is activated.

2. The phase synchronous device as set forth in claim 1, wherein the first signal is an input signal, and the second signal is a feedback output signal.

3. The phase synchronous device as set forth in claim 1, wherein the first and second signals are frequency signals.

4. The phase synchronous device as set forth in claim 1, wherein the first and second signals are clock signals.

5. The phase synchronous device as set forth in claim 1, wherein the transmission unit includes a transmission gate.

6. The phase synchronous device as set forth in claim 1, wherein the slope adjuster is configured to allow the slope of the phase detection signal to be adjusted by an RC element.

7. The phase synchronous device as set forth in claim 6, wherein the RC element is a capacitor.

8. The phase synchronous device as set forth in claim 6, wherein the slope adjuster is configured to adjust the slope of the phase detection signal such that an output current of the charge pumping unit reaches a predetermined current level while the locking signal is activated.

9. The phase synchronous device as set forth in claim 8, wherein the current level is a reference current level applied to the charge pumping unit.

10. The phase synchronous device as set forth in claim 1, wherein the charge pump includes:
 a charge pump configured to output a current in response to an output of the control signal generator; and
 a loop filter configured to charge/discharge the current to output the control voltage.

11. The phase synchronous device as set forth in claim 1, wherein the phase synchronous device includes a voltage controller configured to control a phase of the second signal.

12. A method for generating a phase synchronous signal, the method comprising the steps of:
 detecting a phase difference between first and second signals to output a phase detection signal and a locking signal, wherein the locking signal is enabled when phases of the first and second signals approach within a predetermined range to be locked;
 adjusting a slope of the phase detection signal in response to the locking signal so as to output a control signal;
 pumping a current in accordance with the control signal and charging/discharging the current so as to output a control voltage; and
 controlling a phase of the second signal in accordance with the control voltage;
 selecting a path of the phase detection signal corresponding to the locking signal;
 transmitting the phase detection signal to the charge pumping unit as the control signal when the locking signal is not activated; and
 adjusting the slope of the phase detection signal when the locking signal is activated.

13. The method as set forth in claim 12, wherein the adjusting step outputs the control signal having a slope smaller than that of the phase detection signal when the locking signal is activated.

14. The method as set forth in claim 13, wherein the slope of the control signal is adjusted by an RC delay of the phase detection signal.

15. The method as set forth in claim 13, wherein the slope of the control signal is adjusted such that the current level reaches a predetermined current level before the locking signal is not activated.

16. The method as set forth in claim 15, wherein the current level is a reference current level applied to a charge pump.

* * * * *